(12) United States Patent
Kim

(10) Patent No.: US 6,892,801 B1
(45) Date of Patent: May 17, 2005

(54) THERMAL CONTROL APPARATUS FOR ELECTRONIC SYSTEMS

(75) Inventor: David K. J. Kim, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 2 days.

(21) Appl. No.: 10/757,930

(22) Filed: Jan. 15, 2004

(51) Int. Cl.[7] ............................................. F28D 15/00
(52) U.S. Cl. .............. 165/104.33; 165/67; 165/104.21; 361/700
(58) Field of Search .............................. 165/185, 80.3, 165/104.33, 67, 76, 104.26, 104.21; 361/700, 361/687, 699, 702, 717–719, 722; 257/714, 257/719; 174/15.2; 411/393, 410; 285/390–391, 285/915, 291.1, 291.2

(56) References Cited

U.S. PATENT DOCUMENTS

| | | | | |
|---|---|---|---|---|
| 3,769,551 | A | * | 10/1973 | Corman et al. ............. 361/676 |
| 4,005,297 | A | * | 1/1977 | Cleaveland ................. 218/118 |
| 4,131,785 | A | * | 12/1978 | Shutt .......................... 392/458 |
| 4,389,002 | A | * | 6/1983 | Devellian et al. ......... 222/146.4 |
| 4,638,854 | A | * | 1/1987 | Noren ......................... 165/76 |
| 4,688,537 | A | * | 8/1987 | Calkins et al. .............. 123/557 |
| 5,095,403 | A | * | 3/1992 | Pin et al. .................... 361/641 |
| 5,949,647 | A | * | 9/1999 | Kolman et al. ............. 361/700 |
| 6,179,841 | B1 | * | 1/2001 | Jackson ....................... 606/73 |
| 6,385,044 | B1 | * | 5/2002 | Colbert et al. .............. 361/700 |
| 6,625,021 | B1 | | 9/2003 | Lofland et al. |
| 6,785,135 | B1 | | 8/2004 | Ohmi et al. |
| 6,788,537 | B1 | | 9/2004 | Saita et al. |

FOREIGN PATENT DOCUMENTS

WO     WO00/14469     * 3/2000

* cited by examiner

Primary Examiner—Tho v Duong
(74) Attorney, Agent, or Firm—Meyertons Hood Kivlin Kowert & Goetzel, P.C.; B. Noël Kivlin

(57) ABSTRACT

A thermal control apparatus using heat pipes. The thermal control apparatus includes a heat pipe having a hollow interior at least partially filled with a vaporizable liquid. The heat pipe further includes a threaded outer surface configured for coupling the heat pipe into an aperture having a threaded inner surface. The threaded outer surface maybe an integral portion of the heat pipe, or may be implemented using a separate piece that coupled to the heat pipe. A thermal control apparatus using the heat pipes may be implemented with a heat spreader having one or more apertures, wherein each of the apertures includes a threaded inner surface. A heat pipe having a threaded outer surface may be positioned in one of the apertures. The thermal control apparatus may be mounted on a printed circuit board in the proximity of one or more electronic components.

15 Claims, 8 Drawing Sheets

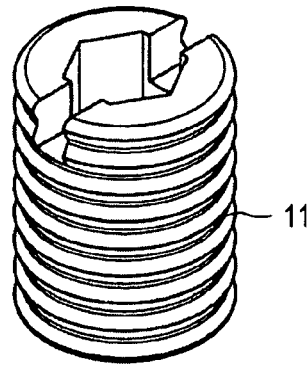
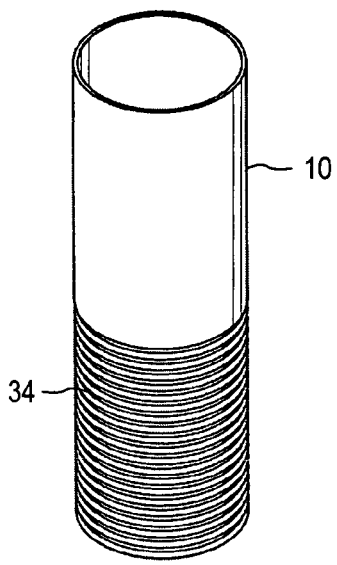
Fig. 6
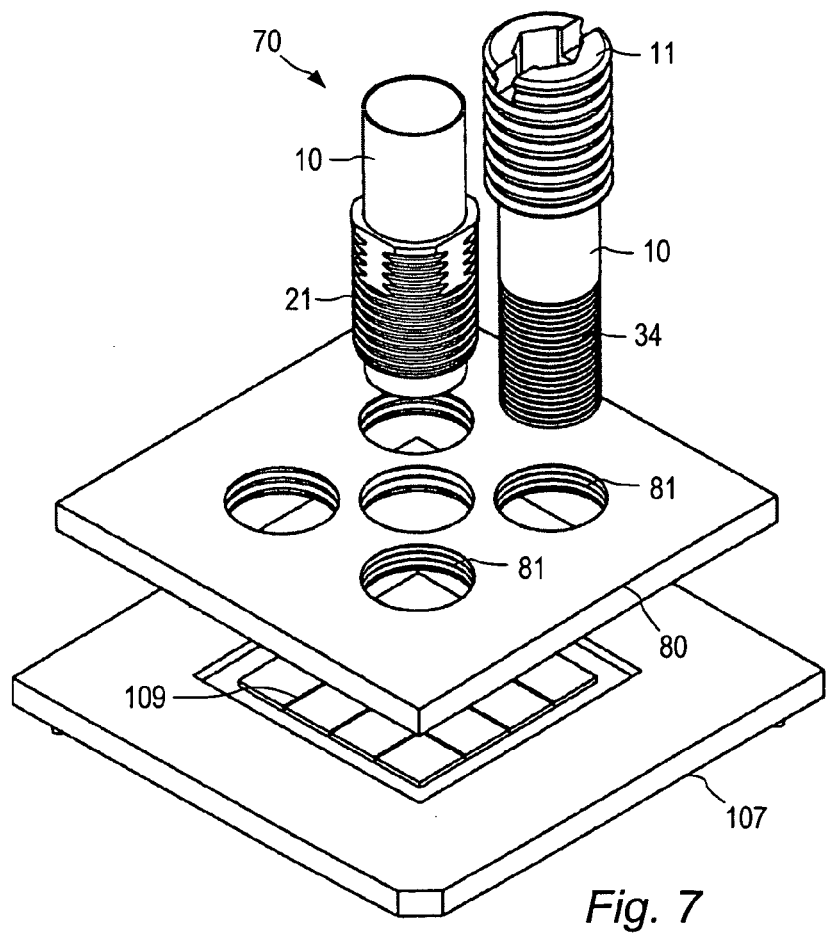
Fig. 7

THERMAL CONTROL APPARATUS FOR ELECTRONIC SYSTEMS

BACKGROUND OF THE INVENTION

1. Field of the Invention

This method relates to electronic systems, and more particularly, to methods of cooling electronic systems.

2. Description of the Related Art

One important aspect in the design of computers and other electronic systems is controlling the transfer of heat from heat-generating components in order to prevent these components from overheating. The inability to prevent overheating of such components can lead to erroneous operation, and if severe enough, failure of these components. This is particularly true for various types of integrated circuits and multi-chip modules. Traditional methods for transferring heat electronic systems include the use of heat sinks and fans.

One alternative to the traditional methods for heat transfer in electronic systems is the use of heat pipes mounted on components that generate a significant amount of heat. A heat pipe is a hollow cylinder that is at least partially filled with a vaporizable liquid. FIG. 1 illustrates the operation of one embodiment of a heat pipe. When the component to which the heat pipe is mounted generates enough heat, the liquid in the heat pipe absorbs this heat and thus causes its temperature to rise. When the temperature of the liquid reaches its boiling point, at least some of the liquid boils into a vapor phase. The vapor then rises into the upper portion of the heat pipe, where some of the heat is released. When enough of the heat is released, the vapor condenses and returns to a liquid state and returns to the lower portion of the heat pipe. This cycle repeats itself as long as the component to which the heat pipe is mounted generates a sufficient amount of heat. In this manner, a heat pipe can continuously transfer heat away from the component to which it is mounted.

One of the problems in mounting heat transfer devices such as heat pipes to electronic components involves ensuring sufficient contact. It is often times difficult to completely eliminate gaps between the surface of a heat transfer device and the device to which it is to be mounted (e.g., an integrated circuit package). This is because it is difficult to make the surface of such a component entirely flat. Since air is a very poor conductor of heat, any air gaps between the heat transfer device and its associated component can significantly reduce its effectiveness. While certain materials are available that can be used to eliminate the air gaps, these materials may not be as effective in transferring heat from the surface of the component to the heat transfer device. Thus, the inability to control the surface contact (as well as the inability to control the surface contact pressure) may reduce the effectiveness of heat transfer devices such as heat pipes.

SUMMARY OF THE INVENTION

A thermal control apparatus using heat pipes is disclosed. In one embodiment, the thermal control apparatus includes a heat pipe having a hollow interior that is at least partially filled with a vaporizable liquid. The heat pipe further includes a threaded outer surface configured for coupling the heat pipe into an aperture having a complementary threaded inner surface. The threaded outer surface may, in one embodiment, be an integral portion of the heat pipe. In other embodiments, the threaded outer surface may be implemented using a separate piece that may be coupled to the heat pipe. A thermal control apparatus using the heat pipes may be implemented with a heat spreader having one or more apertures, wherein each of the apertures includes a threaded inner surface. A heat pipe having a threaded outer surface may be positioned in one of the apertures. The thermal control apparatus may be mounted on a printed circuit board in the proximity of one or more electronic components.

BRIEF DESCRIPTION OF THE DRAWINGS

Other aspects of the invention will become apparent upon reading the following detailed description and upon reference to the accompanying drawings in which:

FIG. 6 is a drawing illustrating one embodiment of a heat pipe having a threaded outer surface;

FIG. 7 is a drawing of one embodiment of a thermal control apparatus utilizing heat pipes;

Figure 2:
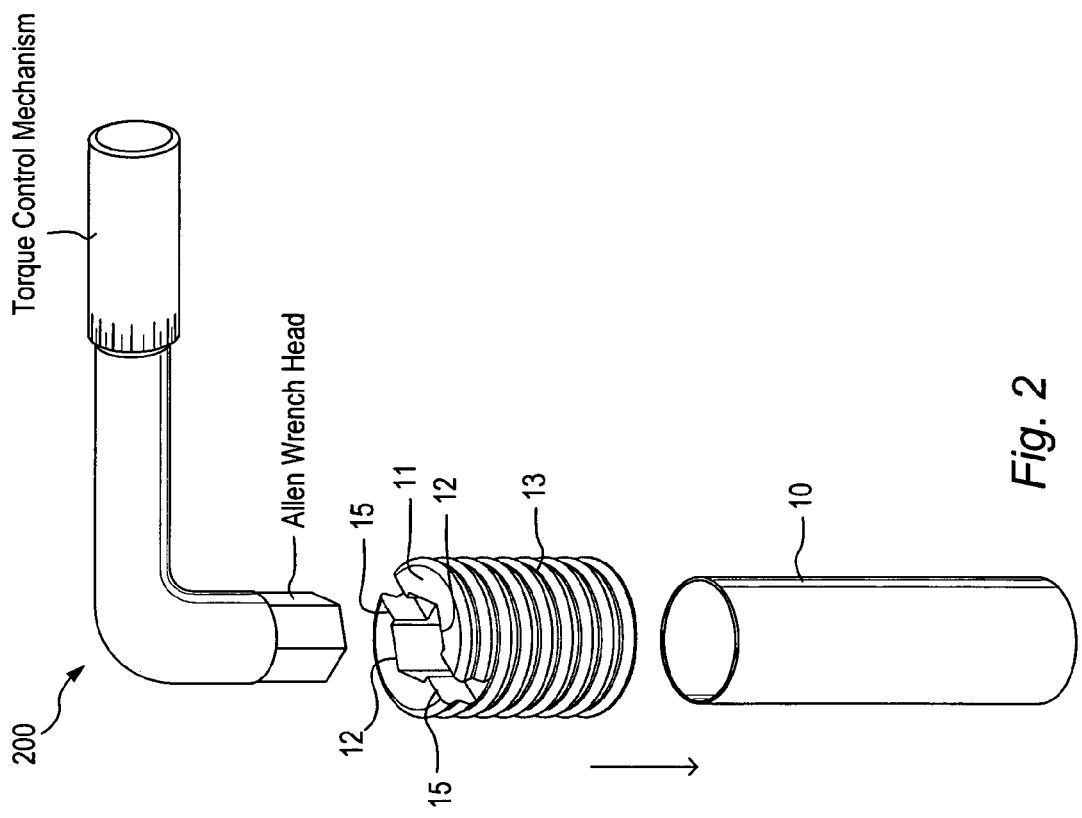
FIG. 2 is a drawing illustrating one embodiment of a heat pipe and a threaded cap.
Figure 1:
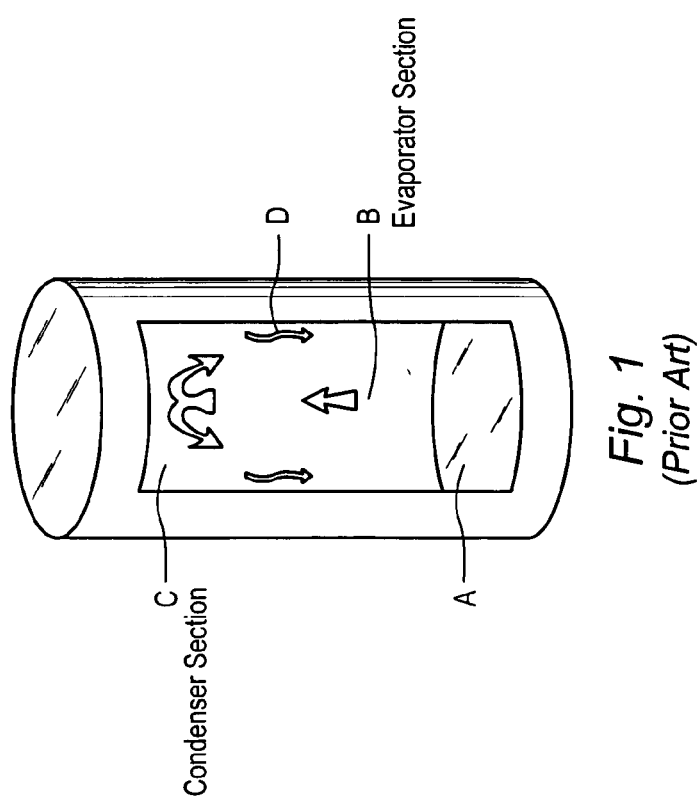
FIG. 1 (Prior Art) is a drawing illustrating the operation of one embodiment of a heat pipe.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 2, a drawing illustrating one embodiment of a heat pipe and a threaded cap is shown. In the embodiment shown, threaded cap 15 is configured to be coupled to heat pipe 10. When coupled together, heat pipe 10 and threaded cap 11 effectively form a heat transfer device having a threaded outer surface.

Heat pipe 10 may be a standard heat pipe having a hollow interior that is at least partially filled with a vaporizable fluid, which may initially be in a liquid state. When heated, the temperature of the vaporizable fluid may reach its boiling point, thereby causing some of the liquid to vaporize.

The vaporized fluid may then rise, and some of its heat may be drawn away through the material of the heat pipe that encloses the fluid. When enough heat has been drawn away, the vaporized fluid may then return to its liquid state. This process may occur continuously in the heat pipe when it is receiving sufficient heat, such as when it is coupled to a heat-generating electronic device during operation of that device.

Threaded cap 11 may be formed with a material that is thermally conductive (e.g. various metals) or may be formed with a material that is thermally insulative (e.g. plastic). Threaded cap 11 may be formed using more than one type of material in some embodiments, or may be formed of a single type of material in other embodiments.

A plurality of threads 13 are present on the outer surface of threaded cap 11, and thus form a threaded outer surface on heat pipe 10 when threaded cap 11 and heat pipe 10 are coupled together. Threaded cap 11 also includes a cavity 12 in the embodiment shown. The shape of cavity 12 in this particular embodiment is such that it is configured to receive an Allen wrench. Furthermore, the Allen wrench may be torque-controlled, which may allow controlling of the contact pressure (by controlling the torque) when threaded cap is positioned into an aperture having complementary threading (and thereby control contact pressure of an attached heat pipe 10). An exemplary embodiment of a torque-controlled Allen wrench 200 is shown here.

Threaded caps having cavities shaped to allow other types of tooling are also possible and contemplated. For example, the embodiment shown in FIG. 2 also includes a slot 15 which may be suitable for receiving the blade of a screwdriver. Other types of tooling may also allow for a controllable torque setting, as does the torque-controlled Allen wrench shown in the drawing (e.g. a torque controlled screwdriver or other type of torque-controlled wrench).

Figure 3A:
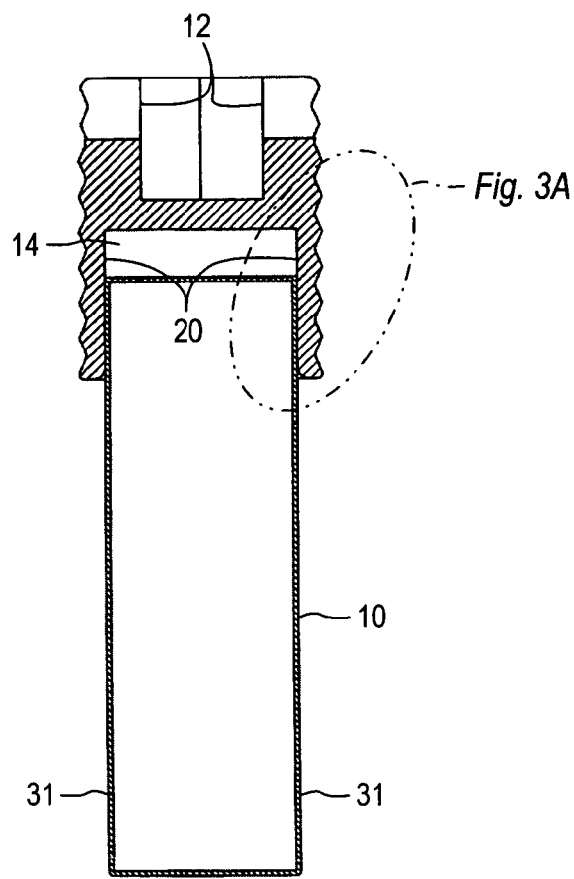
FIG. 3A is a drawing illustrating one embodiment of a heat pipe coupled to a threaded cap.
Figure 3B:
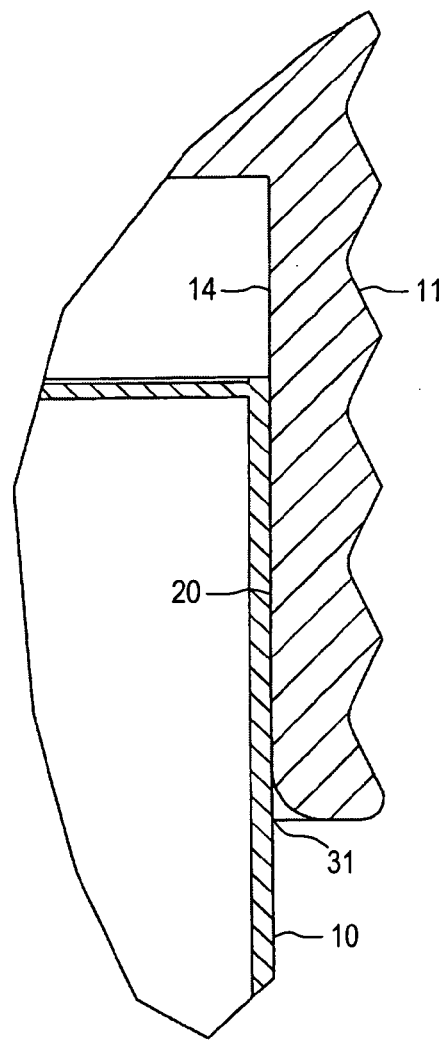
FIG. 3B is a drawing illustrating additional detail for one embodiment of a heat pipe coupled to a threaded cap.

FIGS. 3A and 3B illustrate additional details concerning the coupling of one embodiment of a threaded cap 11 to a heat pipe 10. FIG. 3A is a drawing illustrating one embodiment of a heat pipe coupled to a threaded cap. In the embodiment shown, heat pipe 10 is coupled to threaded cap 11 by inserting one end into cavity 14. In one embodiment, heat pipe 10 may be held securely in place relative to threaded cap 11 by pressure (i.e. friction) from the inner surfaces 20 of cavity 14. In another embodiment, the inner surfaces of cavity 14 may be lined with an adhesive material that holds heat pipe 10 securely in place relative to threaded cap 11.

In FIG. 3B, the contact between outer surfaces 31 of heat pipe 10 and inner surfaces 20 of threaded cap 11 is illustrated. While it is noted that the embodiment shown includes a gap between the uppermost surface of heat pipe 10 and the horizontal inner surface of cavity 14, embodiments are possible and contemplated wherein the horizontal inner surface of cavity 14 is in contact with the uppermost surface of heat pipe 10.

Figure 4:
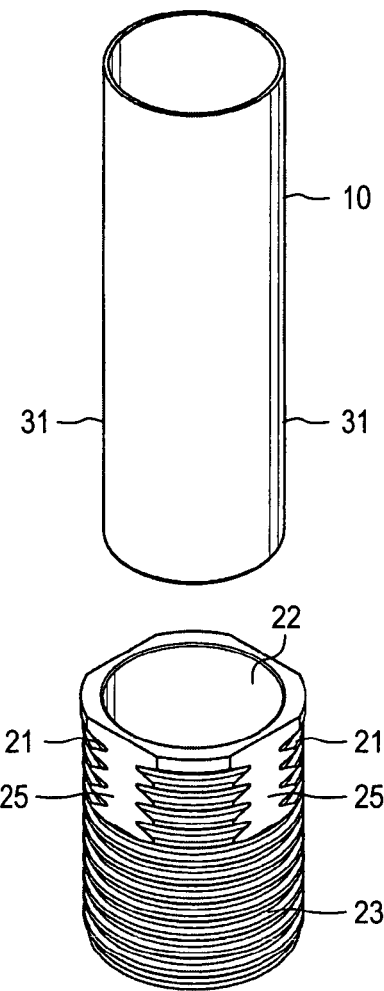
FIG. 4 is a drawing illustrating one embodiment of a heat pipe and a threaded sleeve configured to be coupled to the heat pipe.

Moving now to FIG. 4, a drawing illustrating one embodiment of a heat pipe and a threaded sleeve configured to be coupled to the heat pipe is shown. In the embodiment shown, threaded sleeve 21 is configured to receive heat pipe 10 in hollow portion 22. Threaded sleeve 21 also includes a threaded surface 23 on its outer surface that allows it to be coupled to an aperture having complementary threading.

Figure 5A:
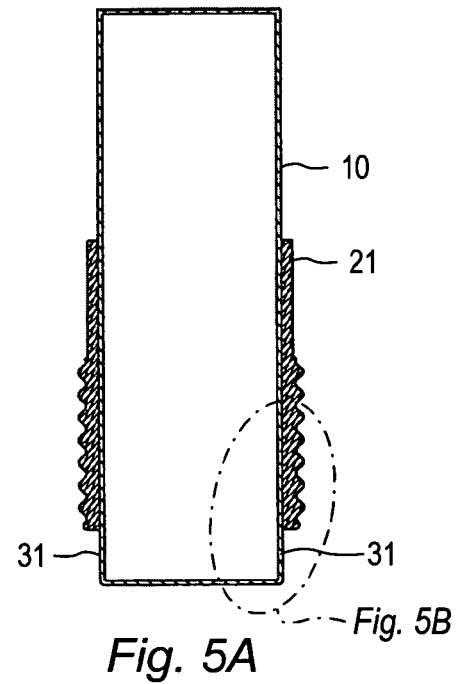
FIG. 5A is a drawing illustrating one embodiment of a heat pipe coupled to a threaded sleeve.
Figure 5B:
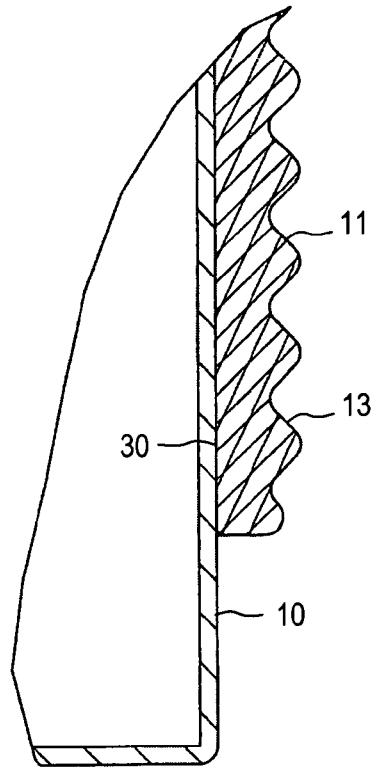
FIG. 5B is a drawing illustrating additional detail of one embodiment of a heat pipe coupled to a threaded sleeve.

Heat pipe 10 may be coupled to threaded sleeve 21 by inserting it into hollow portion 22. As shown in FIGS. 5A and 5B, when coupled, the outer surfaces 31 of heat pipe 10 may be in contact with inner surfaces 30 of threaded sleeve 21. As with the embodiment discussed above, heat pipe 10 may be held securely in place relative to threaded sleeve 21 by pressure-induced friction from inner surfaces 30 in one embodiment, or by an adhesive material lining inner surfaces 30 in another embodiment. When coupled together, heat pipe 10 and threaded sleeve 21 effectively form a heat transfer device having a threaded outer surface, the device being suitable for mounting in an aperture having a complementary threaded inner surface.

Threaded sleeve 21 may be formed using various types of materials. In one embodiment, threaded sleeve 21 may be formed of a material that is thermally conductive. In another embodiment, threaded sleeve 21 may be formed of a material that is thermally insulative. Other embodiments of threaded sleeve 21 formed using combinations of thermally insulative and thermally conductive materials are also possible and contemplated.

A plurality of flat areas 25 is also present on the embodiment of threaded sleeve 21 illustrated in FIG. 4. Flat areas 25 may allow threaded sleeve 21 to be gripped by a wrench or other type of tool during the insertion of heat pipe 10 into hollow portion 22, or the mounting of the heat transfer device (i.e. the combination of heat pipe 10 and threaded sleeve 21) into a threaded aperture. The type of tooling used may include torque-controlled tooling (e.g. a torque wrench) which may allow for controlling the amount of contact pressure between a surface of heat pipe 10 and the surface of another object.

FIG. 6 is a drawing illustrating one embodiment of a heat pipe having a threaded outer surface. In the embodiment shown, threaded surface 34 is an integral part of heat pipe 10. The threaded surface may be formed into the surface of the material covering the outer portion of heat pipe 10, and allows heat pipe 10 to be positioned into an aperture having complementary threading.

In the embodiment shown, a threaded cap 11, such as that discussed in above in reference to FIGS. 2, 3A, and 3B may be coupled to heat pipe 10 to provide access for tooling. Other types of tooling mechanisms may be implemented in lieu of those configured for use with the threaded cap. For example, embodiments are also possible and contemplated wherein the surface of heat pipe 10 includes flat areas (similar to those implemented on threaded sleeve 21 discussed above) that may allow the heat pipe to be gripped by a wrench. In general, any type of additional surfacing may be performed on heat pipe 10 to allow for any necessary tooling.

FIG. 7 is a drawing of one embodiment of a thermal control apparatus utilizing heat pipes. In the embodiment shown, thermal control apparatus 70 includes a heat spreader 80, which is configured for coupling to an integrated circuit (IC) package 107. IC package 107 may include one or more silicon device(s) 109 which comprise the integrated circuit(s) within IC package 107. Heat spreader 80, in one embodiment, is formed using a thermally conductive material, and includes apertures 81. Each of apertures 81 includes a threaded inner surface. Various embodiments of heat pipes 10 may be configured for insertion into the apertures 81, including embodiments having a threaded cap 11, a threaded sleeve 21, or a threaded surface 34. In this particular embodiment, IC package 107 may include an opening that allows the heat pipes 10 (when inserted and heat spreader 80 is mounted upon IC package 107) to contact the silicon device(s) 109 mounted in IC package 107. In other embodiments, the silicon device(s) 109 may be encapsulated by the IC package 107. Either one or more of the heat pipes 10 or a portion of heat spreader 70 may be in contact with IC package 107, thereby drawing away heat generated by the operation of the silicon device(s) 109 within to the package. Any heat pipes 10 present may in turn draw heat from the heat spreader 80 using the process of heat pipe operation discussed above. Thus, the combination of heat spreader 80 and heat pipes 10 may provide localized cooling to IC package 107.

Figure 8:
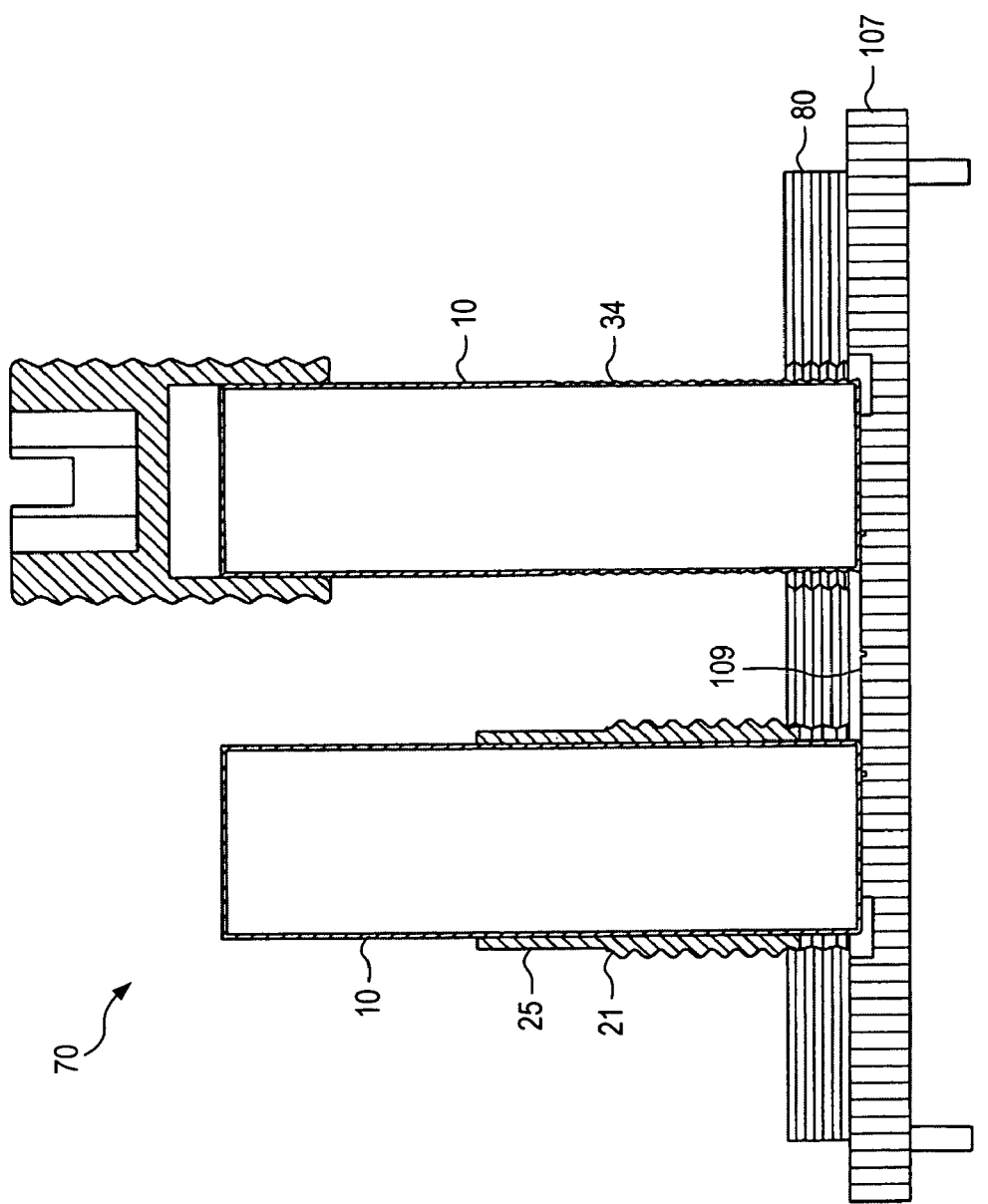
FIG. 8 is a side view drawing of one embodiment of a thermal control apparatus utilizing heat pipes.

FIG. 8 is a side view drawing of one embodiment of a thermal control apparatus utilizing heat pipes. In the embodiment shown, thermal control apparatus 70 is mounted on IC package 107, which includes two apertures in which heat pipes 10 are mounted. Each of the heat pipes 10 is in contact with a portion of the silicon device(s) 109 that are mounted within IC package 107. In this particular example, a heat pipe 10 having a threaded sleeve 21 and a heat pipe 10 having a threaded surface 34 are mounted within the apertures 81 of heat spreader 80. The heat pipe 10 having a threaded surface 34 also includes a threaded cap 11 for tooling purposes. The threads of the threaded sleeve 21 and threaded surface 34 allow their respective heat pipes 10 to be screwed into their respective apertures. The amount of contact pressure between each of the heat pipes 10 and silicon device(s) 109 may be controlled by using torque-controlled tooling (e.g. torque wrench 200 shown in FIG. 2).

During operation of the integrated circuit(s) within IC package 107, heat may be drawn away from silicon device(s) 109 directly through each of heat pipes 10, as well as through the packaging material (e.g. ceramic) of IC package 107. Heat pipes 10 may draw heat from both silicon device(s) 109 and the packaging material.

Figure 9:
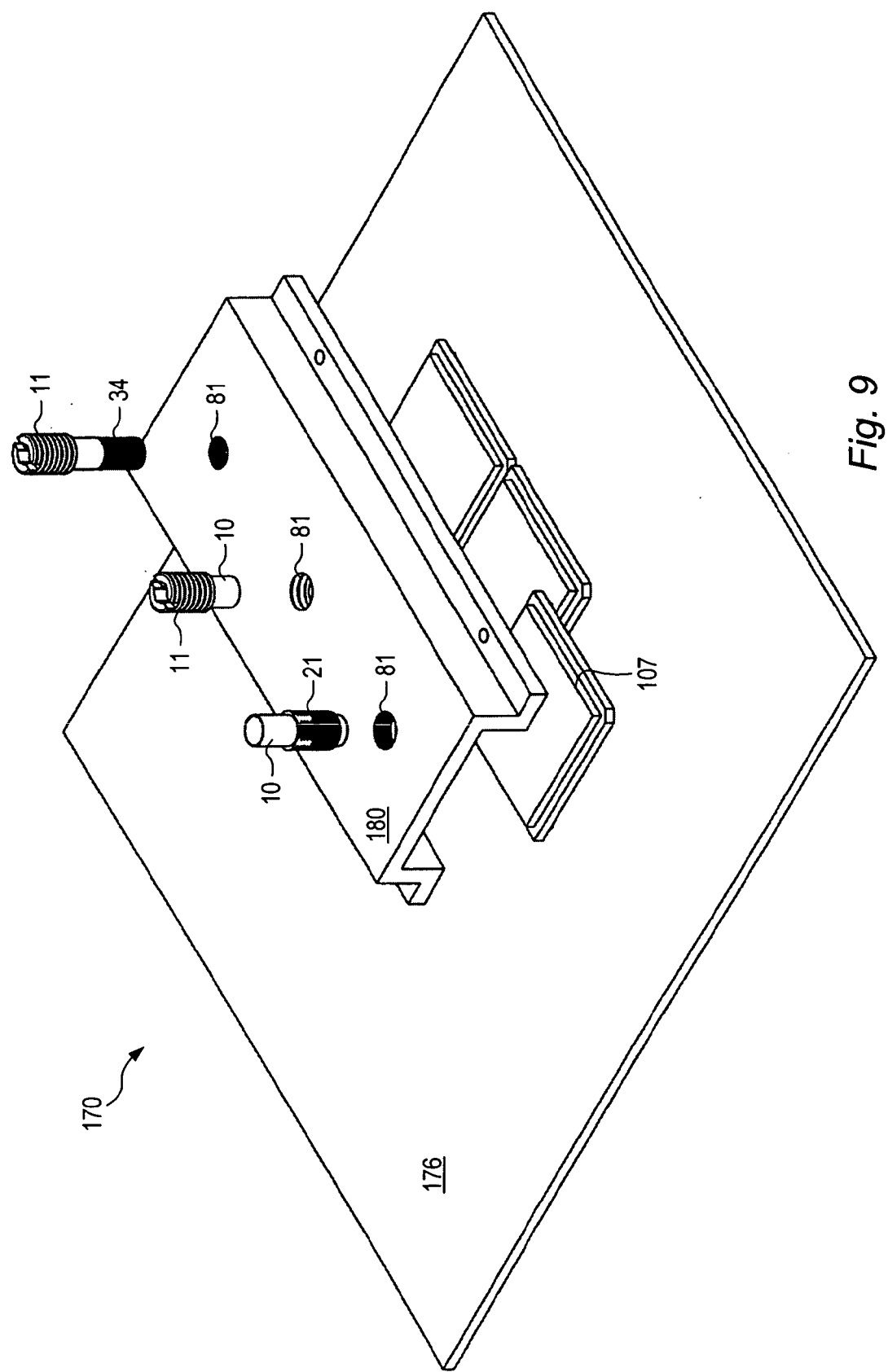
FIG. 9 is a drawing of another embodiment of a thermal control apparatus utilizing heat pipes.

FIG. 9 is a drawing of another embodiment of a thermal control apparatus utilizing heat pipes. In the embodiment shown, thermal control apparatus 170 includes a heat spreader 180, which is mountable on printed circuit board (PCB) 176. A plurality of IC packages 107 may be mounted on PCB 176. In the embodiment shown, heat spreader 180 is configured to be mounted such that it at least partially covers a plurality of IC packages 107.

In the embodiment shown, thermal control apparatus includes a plurality of heat pipes 10, each of which is mountable in one of the apertures 81 present in heat spreader 180. When thermal control apparatus 170 is mounted to PCB 176, a portion of the thermal control apparatus may be in direct contact with one or more of the IC packages 107. For example, one or more of the heat pipes 10 may be in contact with an IC package when thermal control apparatus 170 in one embodiment. In another embodiment, a portion of heat spreader 180 may be in contact with one or more of IC packages 107. Embodiments wherein both heat spreader 180 and one or more heat pipes 10 are in contact with an IC package 107 are also possible and contemplated.

Figure 10:
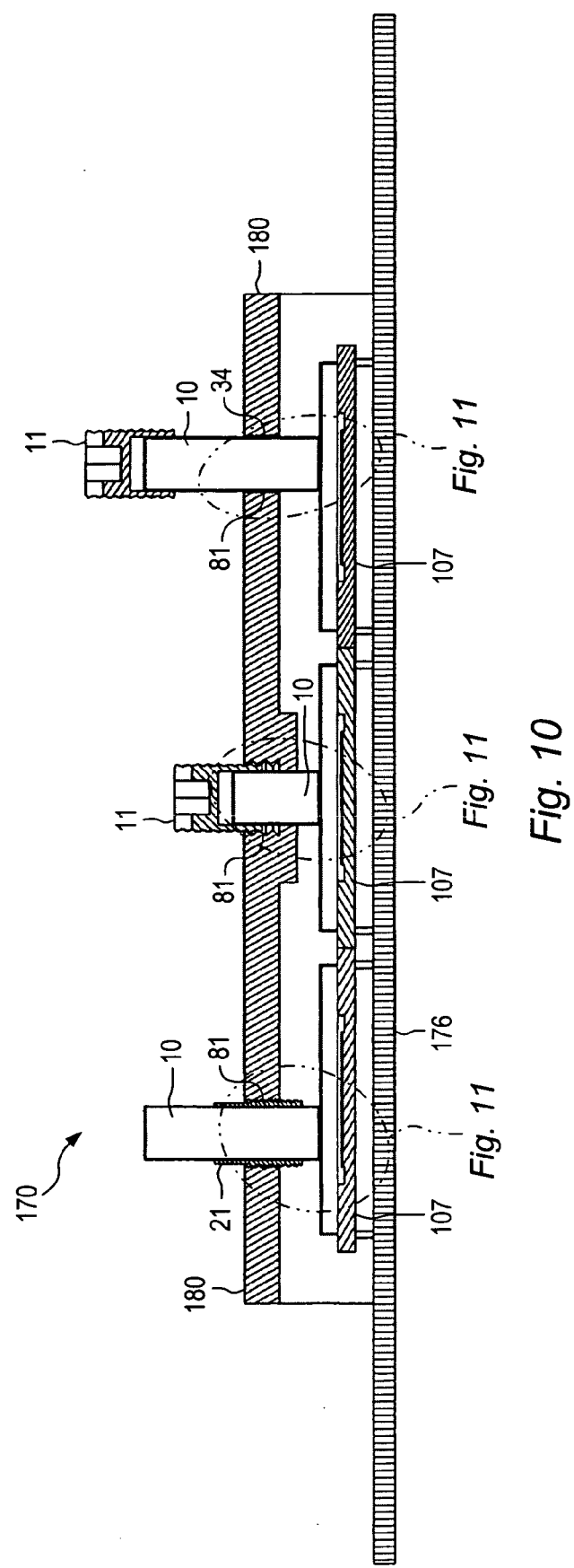
FIG. 10 is a side view drawing of another embodiment of a thermal control apparatus utilizing heat pipes.
Figure 11:
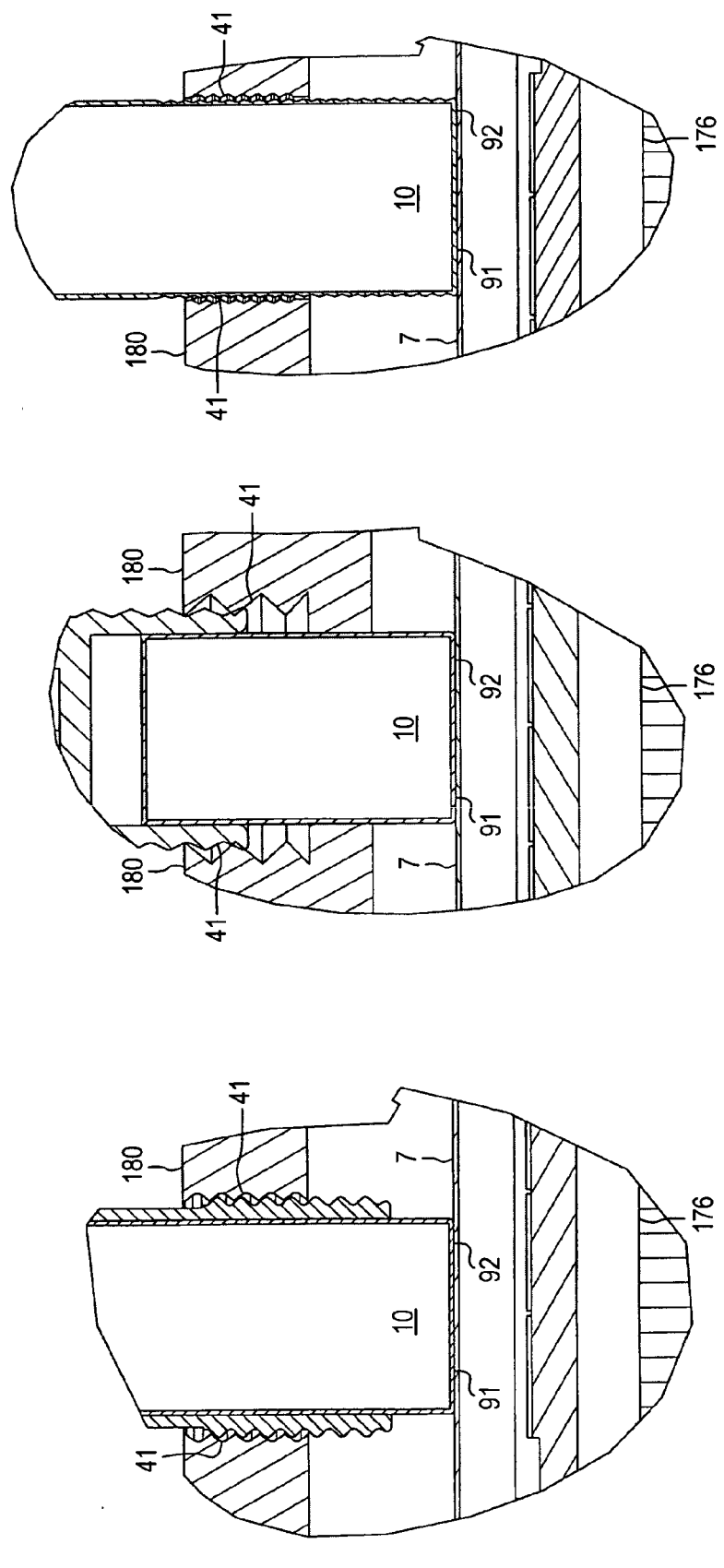
FIG. 11 is a drawing illustrating additional details for another embodiment of a thermal control apparatus.

FIG. 10 is a side view drawing of another embodiment of a thermal control apparatus utilizing heat pipes, illustrating the mounting of heat pipes 10 in apertures 81 of heat spreader 180. In the embodiment shown, one of each of the variations discussed above for mounting heat pipes 10 is shown. The first heat pipe 10 (left-most in the drawing) is mounted into an aperture 81 via a threaded sleeve. The second (middle) heat pipe 10 is mounted via a threaded cap 11, with the cap itself screwed into the associated aperture 81. The third heat pipe 10 is mounted via threaded surface 34, although it also includes a threaded cap 11 for tooling purposes (it should be noted however that the threaded cap 11 is not necessarily required for various embodiments of heat pipe 10 wherein a threaded surface 34 is present). FIG. 11 illustrates a closer view of the details for each of the heat pipe mountings.

Each of the heat pipes 10 shown in the embodiment of FIG. 10 is mounted such that it is in contact with an IC package 107. As with various embodiments discussed above, the contact pressure between the each of the heat pipes 10 and its associated IC package 107 may be controlled by using torque-controlled tooling during the mounting process. During operation of the integrated circuits of IC packages 107, heat generated by the integrated circuits may be drawn away from IC packages 107 through heat pipes 10. Some of the heat drawn away by heat pipes 10 may be radiated into the surrounding air, with heat spreader 180 drawing away additional heat. By mounting the heat pipes 10 and the heat spreader 180, localized cooling may be provided for each of the IC packages 107. The mounting configuration shown may provide for more efficient heat transfer between heat pipes 10 and IC packages 107, as well as between heat pipes 10 and heat spreader 180.

It should be noted that the combination of heat pipes and their respective mounting apparatuses shown in FIG. 10 is for illustrative purposes, and embodiments encompassing virtually any combination are possible and contemplated. Furthermore, embodiments wherein only one type of heat pipe mounting apparatus is present are also possible and contemplated.

It is further noted that the heat spreaders shown in the above examples are illustrative, and that heat spreaders of different sizes, shapes, and configuration are possible and contemplated. The heat spreaders may be mounted in the proximity of any type of heat generating electronic device, such as voltage regulators, power supplies, and so on.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A heat transfer device comprising:
a heat pipe, the heat pipe having a hollow interior partially filled with a vaporizable liquid; and
a threaded outer surface covering at least a portion of the heat pipe, wherein the threaded outer surface is configured for coupling the heat pipe into an aperture having a complementary threaded inner surface; wherein the threaded outer surface comprises a cap, the cap including a first cavity configured for receiving the heat pipe and a second cavity configured for receiving an Allen wrench.

2. The heat transfer device as recited in claim 1, wherein the Allen wrench is a torque-controlled Allen wrench.

3. The heat transfer device as recited in claim 1, wherein the cap is formed of a thermally conductive material.

4. A thermal control apparatus for an electronic system, the thermal control apparatus comprising:
a heat spreader formed of a thermally conductive material and mountable in proximity to one or more electronic devices on a printed circuit board (PCB), wherein the heat spreader includes at least one aperture having a threaded inner surface; and
a heat pipe having a threaded outer surface positioned within the at least one aperture of the heat spreader, wherein the threaded outer surface comprises a cap, the cap including a first cavity configured for receiving the heat pipe, and wherein the cap includes a second cavity configured for receiving an Allen wrench.

5. The thermal control apparatus as recited in claim 4, wherein the heat pipe includes a hollow interior partially filled with a vaporizable liquid.

6. The thermal control apparatus device as recited in claim 4, wherein the Allen wrench is a torque-controlled Allen wrench.

7. The thermal control apparatus as recited in claim 4, wherein the cap is formed of a thermally conductive material.

8. The thermal control apparatus as recited in claim 4, wherein the heat spreader includes a plurality of apertures, wherein each of the plurality of apertures includes a threaded inner surface, and wherein the thermal control apparatus further includes a plurality of heat pipes, wherein each of the plurality of heat pipes is positioned within one of the plurality of apertures.

9. An electronic assembly comprising:
a printed circuit board (PCB);
one or more electronic devices mounted to the PCB; and
a thermal control apparatus coupled to the PCB, wherein the thermal control apparatus includes:
 a heat spreader formed of a thermally conductive material and mounted in proximity to at least one of the one or more electronic devices, wherein the heat spreader includes at least one aperture having a threaded inner surface; and
 a heat pipe having a threaded outer surface positioned within the at least one aperture of the heat spreader, wherein the threaded outer surface comprises a cap, the cap including a first cavity configured for receiving the heat pipe, and wherein the cap includes a second cavity configured for receiving an Allen wrench;
wherein at least a portion of the thermal control apparatus is in contact with the at least one of the one or more electronic devices.

10. The electronic assembly as recited in claim 9, wherein at least a portion of the heat pipe is in contact with a surface of the at least one of the one or more electronic devices.

11. The electronic assembly as recited in claim 9, wherein at least a portion of the heat spreader is in contact with a surface of the at least one of the one or more electronic devices.

12. The electronic assembly as recited in claim 9, wherein the heat pipe includes a hollow interior partially filled with a vaporizable liquid.

13. The electronic assembly device as recited in claim 9, wherein the Allen wrench is a torque-controlled Allen wrench.

14. The electronic assembly as recited in claim 9, wherein the cap formed of a thermally conductive material.

15. The electronic assembly as recited in claim 9, wherein the heat spreader includes a plurality of apertures, wherein each of the plurality of apertures includes a threaded inner surface, and wherein the thermal control apparatus further includes a plurality of heat pipes, wherein each of the plurality of heat pipes is positioned within one of the plurality of apertures.

* * * * *